(12) United States Patent
Beer (10) Patent No.: US 7,573,761 B2
(45) Date of Patent: Aug. 11, 2009

(54) INTEGRATED ELECTRICAL MODULE WITH REGULAR AND REDUNDANT ELEMENTS

(75) Inventor: Peter Beer, Weilhelm (DE)

(73) Assignee: Qimonda AG, Munich (DE)

(*) Notice: Subject to any disclaimer, the term of this patent is extended or adjusted under 35 U.S.C. 154(b) by 0 days.

(21) Appl. No.: 11/756,468

(22) Filed: May 31, 2007

(65) Prior Publication Data
US 2007/0280011 A1 Dec. 6, 2007

(30) Foreign Application Priority Data
May 31, 2006 (DE) .................. 10 2006 025 291

(51) Int. Cl.
*G11C 7/00* (2006.01)
*G11C 29/00* (2006.01)

(52) U.S. Cl. ............................. 365/200; 365/230.03
(58) Field of Classification Search ............. 365/200
See application file for complete search history.

(56) References Cited

U.S. PATENT DOCUMENTS

| 5,430,679 | A * | 7/1995 | Hiltebeitel et al. | 365/200 |
| 5,978,291 | A * | 11/1999 | Kirihata | 365/200 |
| 6,434,066 | B1 * | 8/2002 | Waller et al. | 365/200 |
| 6,853,596 | B2 * | 2/2005 | Cheung | 365/200 |
| 7,142,471 | B2 * | 11/2006 | Fasoli et al. | 365/200 |
| 7,362,628 | B2 * | 4/2008 | Takenaka | 365/200 |

* cited by examiner

*Primary Examiner*—Hoai V Ho
*Assistant Examiner*—Michael J Weinberg
(74) *Attorney, Agent, or Firm*—Patterson & Sheridan, L.L.P.

(57) ABSTRACT

An integrated electrical module has a set of regular elements and a set of redundant elements, the elements being split over at least two blocks which are individually selectable by an input address and respectively containing regular elements and redundant elements. The integrated electrical module further has two repair circuits, each repair circuit being associated to a block, the two repair circuits being conditioned as a pair for a partner mode of operation, in which the addressing of an element from a first half-group of regular elements in the first block is diverted to a first half-group of elements in the second block and the addressing of an element from a second half-group of regular elements in the first block is diverted to a second half-group of elements in the second block.

19 Claims, 4 Drawing Sheets

Fig. 1

(PRIOR ART)

INTEGRATED ELECTRICAL MODULE WITH REGULAR AND REDUNDANT ELEMENTS

CROSS-REFERENCE TO RELATED APPLICATIONS

This application claims foreign priority benefits under 35 U.S.C. §119 to co-pending German patent application number DE 10 2006 025 291.8-55, filed 31 May 2006. This related patent application is herein incorporated by reference in its entirety.

BRIEF DESCRIPTION OF THE DRAWINGS

The features of embodiments will become clear from the following description, taking in conjunction with the accompanying drawings. It is to be noted, however, that the accompanying drawings illustrate only typical embodiments and are, therefore, not to be considered limiting of the scope of the invention. It may admit other equally effective embodiments.

DETAILED DESCRIPTION OF THE PREFERRED EMBODIMENT

An integrated electrical module usually has an addressing device for selecting an element from any of a set of regular elements on a module and a set of redundant elements on the module. A preferred, but not exclusive, area of application is a memory module in which the selectively addressable elements are rows or column groups in a memory matrix.

In electrical modules which contain a multiplicity of selectively addressable elements and a corresponding addressing device, the operation test carried out after manufacture may indicate that one or more of these elements are faulty. Since direct repair of a faulty element is too complex or even impossible in integrated modules, the actual manufacture of the module involves not only the necessary number of regular elements being provided but also a set of additional "redundant" elements which, if needed, can be used as a substitute for faulty elements if they themselves are sound. For this reason, all the redundant elements present naturally likewise need to be subjected to an operation test.

In some integrated modules, the entire set of the elements which are to be selected is accommodated in a plurality of separate sections which can be referred to generally as "blocks" and each of which contains the same number of elements, specifically N regular elements and M redundant elements, respectively. The number M is usually less than N and is proportioned taking into account the frequency of faults which is to be expected.

The elements are typically addressed digitally using a multibit address which contains block address bits for selecting the respective block and element address bits for selecting any element within the block. Each block is provided with a 1-of-N decoder which receives the element address bits and is activated when the relevant block is addressed, in order to select the element identified by these element address bits. If full utilization of the available address field is intended, an integer power of 2 is chosen for the number N, that is to say $N=2^n$, where n is the number of element address bits.

To replace some faulty regular element in a block with a sound instance of the M redundant elements, the test is followed by manipulations on the addressing device in order to ensure that, when the input address for a faulty regular element appears, the 1-of-N decoder is deactivated and the addressing is "diverted" to a respective selected redundant element, to an instance of the M redundant elements in the same block. To this end, each block is additionally provided with one or more programmable reference bit transmitters and with a respective associated comparison device. Each reference bit transmitter can, following the operation test on the module, be programmed for any pattern comprising a plurality of reference bits which correspond to at least one portion of the address of a faulty element. If there is a match between an element address and the reference bits then the 1-of-N decoder is switched off and the addressing is diverted to a redundant element associated with the relevant reference bit transmitter.

It is generally customary to design the reference bit transmitters such that they can be programmed by what is known as "fuse" technology. For this purpose, the circuit nodes of each reference bit transmitter, at which the reference bits are supplied, are connected to a first of the two logic potentials L or H, which represent the binary values "0" and "1", via a respective destructible conductive link. In addition, each of said circuit nodes is connected to the respective other logic potential via a second path. This arrangement is proportioned such that the circuit node is pulled to the first logic potential when the link is undestroyed and is pulled to the other logic potential when the link is destroyed. The links are usually low-value resistors which can be selectively fused, e.g., by a laser beam or applied overvoltage.

Such fusible links or "fuses", as they are called below in line with the usual terminology, require a relatively large amount of space and cannot be miniaturized to the same degree as other circuit components in an integrated module. On the one hand, a fuse takes up a relatively large amount of area just for itself. On the other hand, a relatively large interval needs to be observed both between the fuses and from other circuit parts so that targeted destructive access is easily possible without influencing neighboring components. These space requirements lead to problems and many kinds of restrictions for the production of integrated modules. For this reason, it is desirable to reduce the number of fuses in comparison with the number of selectively addressable regular and redundant elements.

A way of reducing the fuses is to assign each reference bit transmitter not just one redundant element but rather a group of $K=2^k$ redundant elements, where k is a natural number (i.e. an integer $\geq 1$) and each group respectively contains all the elements whose n–k most significant address bits are the same. This reduces the number of reference bit transmitters per block to M/K, and the number of fuses per reference bit transmitter is reduced to n–k. If a regular element in the block is faulty, a reference bit transmitter for the relevant block is programmed to the n–k most significant element address bits for this element. In this case, however, each reference bit transmitter must additionally be provided with a local 1-of-K decoder which responds to the k least significant bits of the n-bit element address in order to select from the group of K associated redundant elements one which is determined by the k least significant bits. Such additional decoders can be miniaturized to a greater degree than the fuses, however.

Using the technique described above, any replacement of a faulty regular element can relate only to a group of K regular elements, specifically to those respective K elements whose n−k most significant address bits match. Usually, the address structure is such that all the elements in each such group are directly adjacent in physical terms. This means that the described technique of grouped association of regular and redundant elements allows what are known as "cluster faults" (or cluster fails) to be managed using a respective single reference bit transmitter. Cluster faults, i.e. the faultiness of a plurality of directly adjacent elements, frequently occur in integrated modules, for example, on account of a contamination which extends over a plurality of elements.

On the other hand, the grouped association described between regular and redundant elements within a block has the result that a respective reference bit transmitter and hence also an entire group of K redundant elements in the block are "used up" also for each single fault or for each cluster fault which comprises just a fraction of K regular elements. This limits the opportunities to replace faulty elements and therefore restricts the flexibility of the repair on the block.

To increase the flexibility of repair for faulty elements in an integrated module and nevertheless to retain the advantages of grouped association between regular and redundant elements, an integrated module is implemented in an integrated electrical module which contains an addressing device for selecting an element from any of a set of regular elements on the module and a set of redundant elements on the module on the basis of the binary values of the bits of an input address. The elements are split over at least two blocks which are individually selectable by block address bits of the input address and respectively contain N regular elements and M<N redundant elements. Each block is provided with a 1-of-N decoder for selecting one of the N regular elements in the block on the basis of n element address bits of the input address, and at least one repair circuit which is associated with a group of $K=2^k$ redundant elements in the block and is connected for the purpose of receiving the n element address bits and which contains a local decoding device and fuses in order, in a first mode of operation, upon receipt of a pattern, which can be programmed by the fuses, for the n−k most significant element address bits, to deactivate the 1-of-N decoder and to activate the local decoding device as a 1-of-K decoder in order to select one of the associated K redundant elements on the basis of the k−1 least significant element address bits.

A switchable connection is set up between at least one repair circuit for each block and precisely one repair circuit for another block. Each of two connected repair circuits contains n−k+1 fuses for programming the n−k+1 most significant bits of an element address. Each pair of interconnected repair circuits can be conditioned for a partner mode of operation in which the local decoding device for one of the two repair circuits is deactivated and the local decoding device for the other repair circuit selects the element identified by the k−1 least significant address bits either from one or the other half of the associated group of K redundant elements on the basis of whether the n−k+1 most significant bits of a received element address match the programming in the one repair circuit or in the other repair circuit.

The two respective repair circuits from two different blocks are conditioned as a pair for a partner mode of operation, in which the addressing of an element from a first half-group of K/2 regular elements in the first block is diverted to a first half-group of K/2 elements in the second block and the addressing of an element from a second half-group of K/2 regular elements in the first block is diverted to a second half-group of K/2 elements in the second block. This has the advantage that, under certain conditions, any faulty regular element in a block can be replaced by a respective redundant element even if the faulty elements within a block are situated with such broad scatter that more groups of K respective regular elements in the block are affected than there are repair circuits for the block.

One form and connection of repair circuits for various blocks and the conditionability thereof for a partner mode of operation allow a group of K redundant elements in a block to be treated as two smaller groups of K/2 respective redundant elements if needed. The reference bit transmitter in the associated repair circuit for the relevant block can make the association between the first smaller group and a first group of K/2 regular elements in the other block. The reference bit transmitter in the partner repair circuit for the other block can make the association between the second smaller group and a second group of K/2 regular elements in the other block.

In the various drawings, parts which are the same or are of the same type are denoted by the respective same reference numerals or abbreviations in upper case letters followed by a respective number or a further letter as a serial number for closer identification. A colon between two numbers or lower case letters should be read as "to". By way of example, "fuses F1:n−1" should be read as "fuses F1 to Fn−1".

The two possible binary values of binary signals and bits are subsequently denoted by the generally customary logic symbols "0" and "1", where "1" represents the "active" state of a binary signal. Bit sources which can be programmed by fuses are represented by small rectangular boxes.

Figure 1:
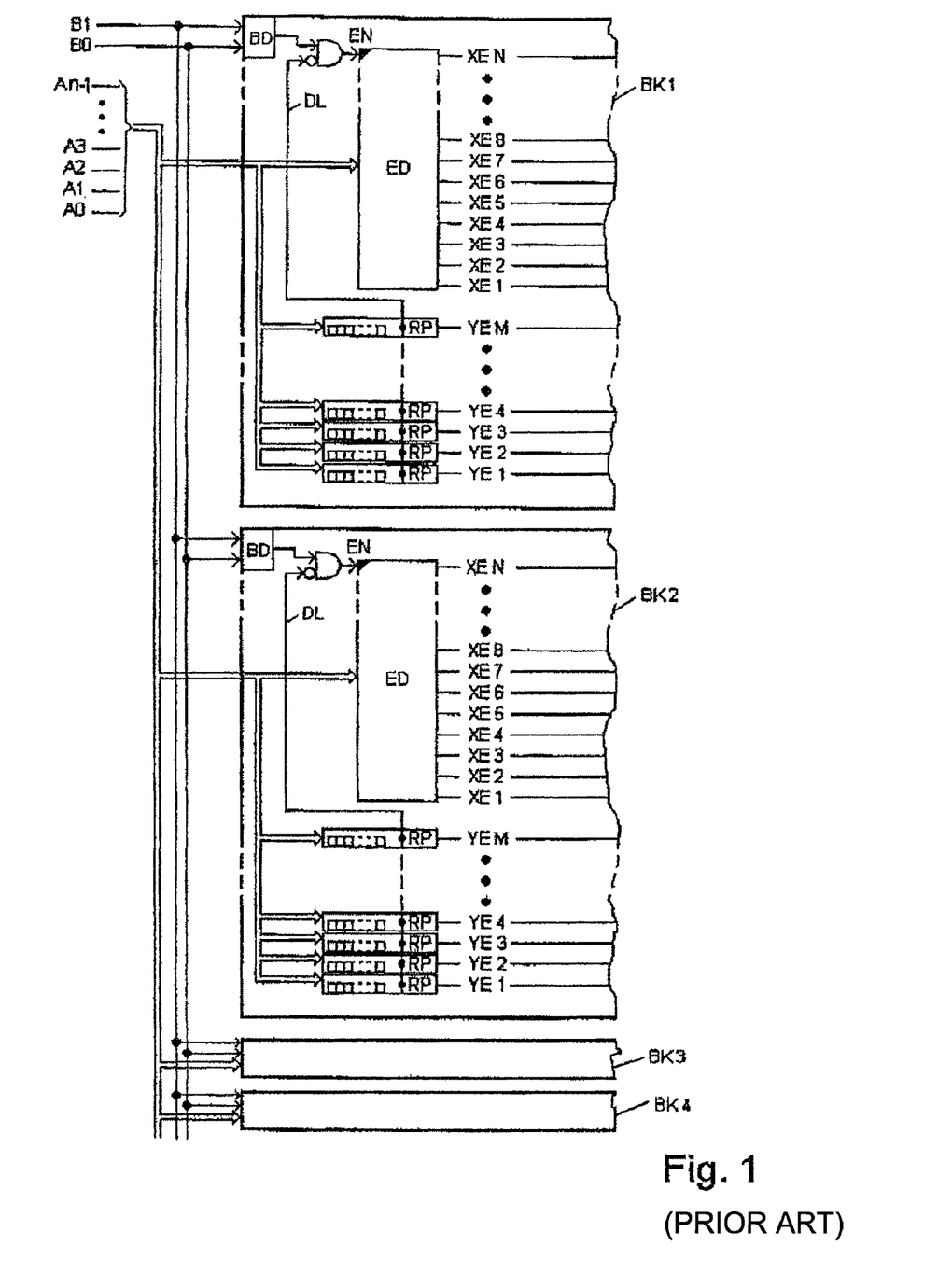
FIG. 1 shows a fragmentary view of an integrated module having a plurality of blocks, each of which contains addressable regular and redundant elements and repair circuits.

The arrangement shown in fragmentary form in FIG. 1 is an electrical module which is integrated on a chip and which contains a plurality of blocks BK1:4 which respectively contain $N=2^n$ regular elements XE1:N of the same type and M redundant elements YE1:M, which are of the same type as the regular elements, which means that each of them, if sound, can be used as a substitute for a faulty regular element. The number M of redundant elements is usually much lower than the number N of regular elements. The number of blocks BK may be arbitrary, usually an integer power of 2. In the example shown, it is four blocks, of which only two blocks BK1:2 are shown in detail for reasons of space, the other blocks BK3:4 merely being indicated as frames.

All the blocks BK1:4 are of the same design and connected to receive an input address which comprises block address bits B0:1 for addressing the block and further n address bits A0:An−1 for addressing any regular element XE within the block. In each block, the block address bits B0:1 are supplied to a block decoder BD, and the element address bits A0:n−1 are supplied to an element decoder ED, which is a 1-of-N decoder, and can be activated by the action of a signal on an input EN in order to select one of the $N=2^n$ regular elements XE1:N on the basis of the n address bits A0:n−1.

Each block BK has a plurality of associated repair circuits RP, each of which is likewise connected to receive the element address bits A0:n−1 and can be programmed in order to trigger a hits signal when a particular pattern of these address bits is received, as a result of which the element decoder ED for the relevant block is deactivated via a deactivation line DL and one of the redundant elements YE in this block is selected. In the example shown in FIG. 1, the element decoder ED is deactivated by means of an AND gate which is connected upstream of the activation input EN of the decoder ED and which logically combines the output of the block decoder BD with the inverted signal on the deactivation line DL. The repair circuits are respectively programmed by means of an associated set of fuses, which are symbolized in FIG. 1 by a series of small squares within each repair circuit RP.

In the case of the module shown in FIG. 1, each repair circuit RP has precisely one redundant element YE respectively associated with it. The design of such a "simple" repair circuit, subsequently denoted by "x1RP", can be seen in FIG. 2.

Figure 2:
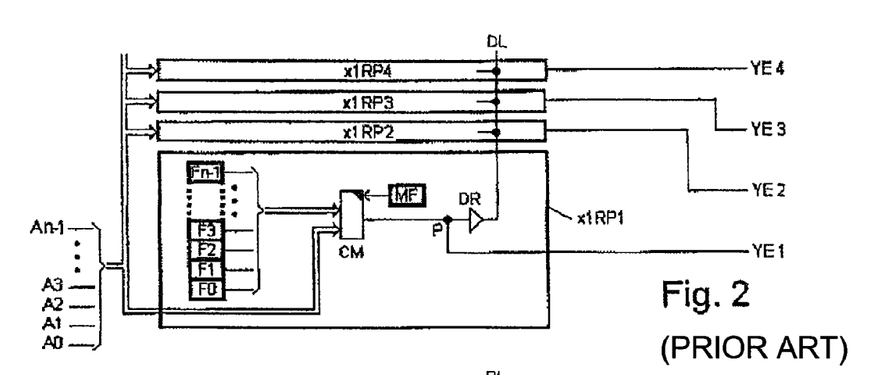
FIG. 2 shows a first embodiment of a repair circuits for replacing regular elements with redundant elements.

FIG. 2 shows only those four single repair circuits x1RP1:4 which belong to the four redundant elements YE1:4 in a block, with only the repair circuit x1RP1 again being shown in detail. Each single repair circuit x1RP contains a reference bit transmitter, comprising n fuses F0:n−1 for programming n reference bits, which correspond to the n element address bits A0:n−1 for a faulty regular element XE, and a comparator CM which can be activated by a "master bit", delivered by a fuse MF, at its activation input EN in order to compare the element address bits with the reference bits. In the event of a match, a circuit node P at the output of the comparator CM changes to the logic value "1" when the comparator has been activated. With the logic value "1", the node P supplies the hits signal; it is connected to the deactivation line DL via a driver DR. The node P is also connected to that redundant element YE which is associated with the relevant repair circuit x1PR. The hits signal (that is to say a "1" at the comparator output) selects this redundant element, deactivating the element decoder ED for the relevant block BK via the driver DR. Since the driver DR operates unidirectionally, it prevents a hits signal from any of the repair circuits being transmitted to another repair circuit in the same block.

For each faulty instance of the regular elements XE (FIG. 1), the n fuses F0:n−1 in precisely one single repair circuit x1RP (FIG. 2) are programmed for the bits A0:n−1 of the address of this faulty element, and the MF fuse in the relevant repair circuit is "blown", so that the master bit MF delivers the logic value "1". Thus, if a faulty regular element is addressed during operation of the module, the circuit node P in the accordingly programmed repair circuit changes to "1", that is to say delivers the hits signal, in order to deactivate the element decoder ED for the addressed block BK and to select the redundant element YE which is associated with the relevant repair circuit.

Figure 3:
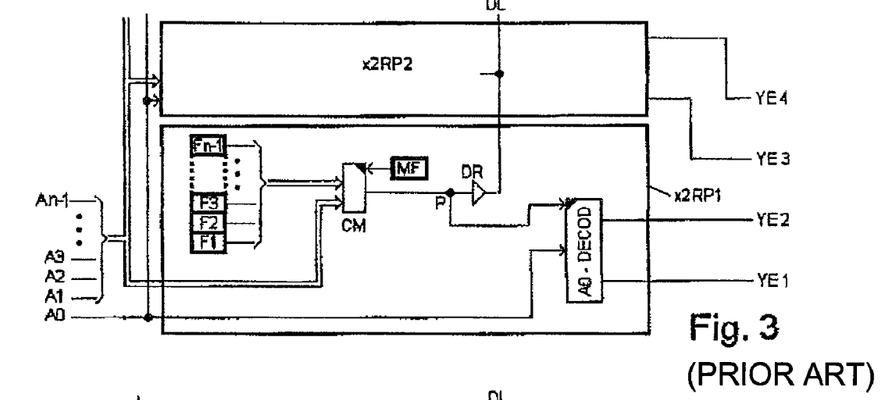
FIG. 3 shows a second embodiment of a repair circuits for replacing regular elements with redundant elements.
Figure 4:
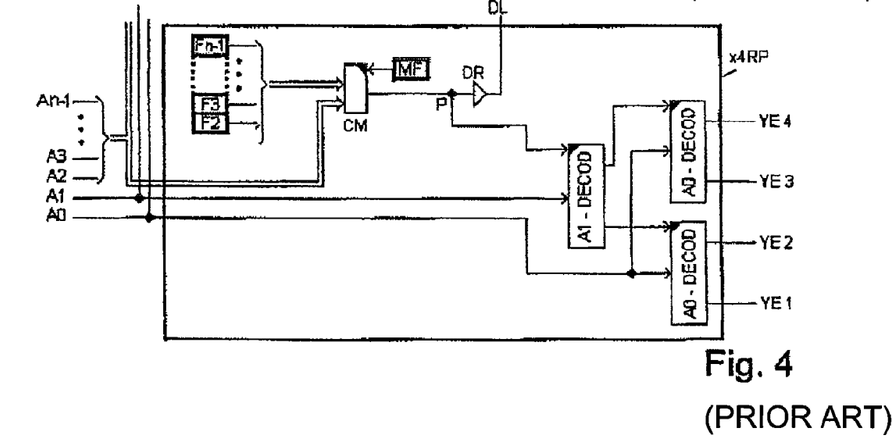
FIG. 4 shows a third embodiment of a repair circuits for replacing regular elements with redundant elements.

As a departure from the embodiment of the module which is shown in FIGS. 1 and 2, a common repair circuit may be provided for a respective group of K>1 redundant elements in order to reduce the number of reference bit transmitters and hence the total number of fuses. To this end, "group-organized" repair circuits need to be provided instead of the single repair circuits x1RP described above. FIGS. 3 and 4 show two examples of such group-organized repair circuits.

FIG. 3 illustrates the example in which a common "two-group" repair circuit x2RP is provided for a respective group of K=2 redundant elements. This repair circuit differs from the "single" repair circuit x1RP shown in FIG. 2 by virtue of the reference bit transmitter containing only the fuses F1:n−1 for programming the n−1 most significant bits A1:n−1 of the element address of a faulty regular element and by virtue of the comparator CM comparing only these bits. The least significant bit A0 of the address is applied to the input of a local "A0 decoder" within the repair circuit x2RP.

If a regular element XE (FIG. 1) in a block is faulty in the case of FIG. 3, the n−1 most significant bits A1:n−1 of the element address of this element are programmed in the reference bit transmitter F1:n−1 of one of the repair circuits x2RP for the relevant block. Hence, the hits signal at point P at the comparator output changes to "1" whenever any element in the group of K=2 regular elements which contains the faulty element is addressed. The hits signal activates the local A0 decoder, which then selects one of the two redundant elements YE in the associated group, specifically the one which is identified by the least significant address bit A0.

FIG. 4 illustrates the example in which a common "four-group" repair circuit x4RP is provided for a respective group of K=4 redundant elements. This repair circuit differs from the "single" repair circuit x1RP shown in FIG. 2 by virtue of the reference bit transmitter containing only the fuses F2:n−1 for programming the n−2 most significant bits A2:n−1 of the element address of a faulty regular element and by virtue of the comparator CM comparing only these bits. The two least significant bits A0:1 of the address are applied to the input of a local 1-of-4 decoder within the repair circuit x4RP. In the example shown, this decoder comprises a tree circuit comprising a 1-of-2 decoder for the address bit A1 (A1 decoder) and two downstream 1-of-2 decoders (A0 decoders) for the address bit A0.

If a regular element XE (FIG. 1) in a block is faulty then in the case in FIG. 4 the n−2 most significant bits A2:n−1 of the element address of this element are programmed in the reference bit transmitter F2:n−1 of one of the four-group repair circuits x4RP for the relevant block. Hence, the hits signal at point P at the comparator output changes to "1" whenever any element in the group of K=4 regular elements which contains the faulty element is addressed. The hits signal activates the local 1-of-4 decoder, which then selects one of the four redundant elements in the associated group, specifically the one which is identified by the two least significant address bits A0:1.

The number K of elements per group can basically be any power k of 2, e.g., including K=8 (that is to say k=3) or K=16 (that is to say k=4), etc. In general terms, any group-organized repair circuit requires a reference bit transmitter for n−k bits in order to program the n−k most significant bits of an element address A0:n−1, and requires a local 1-of-$2^k$ decoder for selecting one of the K redundant elements in the associated group on the basis of the k least significant address bits. Advantageously, both the number N of regular elements and the number M of redundant elements in each block are an integer multiple of K, so that there are N/K disjunct groups of, in each case, K regular elements XE and M/K repair circuits for M/K disjunct groups of K respective redundant elements YE. It is thus possible for (no more than) M/K regular groups to be replaced by a respective redundant group. This allows cluster faults of up to K faulty elements per group to be repaired.

As already mentioned further above, however, it may arise that more than N/K regular groups are affected by faults in a block. In this case, the module may not be repaired at all and needs to be rejected. Such a module to be repaired nonetheless, albeit only under certain prerequisites, will be described in more detail later.

The text below uses an exemplary embodiment with reference to FIG. 5 to explain how this repair option is provided through a particular form of group-organized repair circuits.

Figure 5:
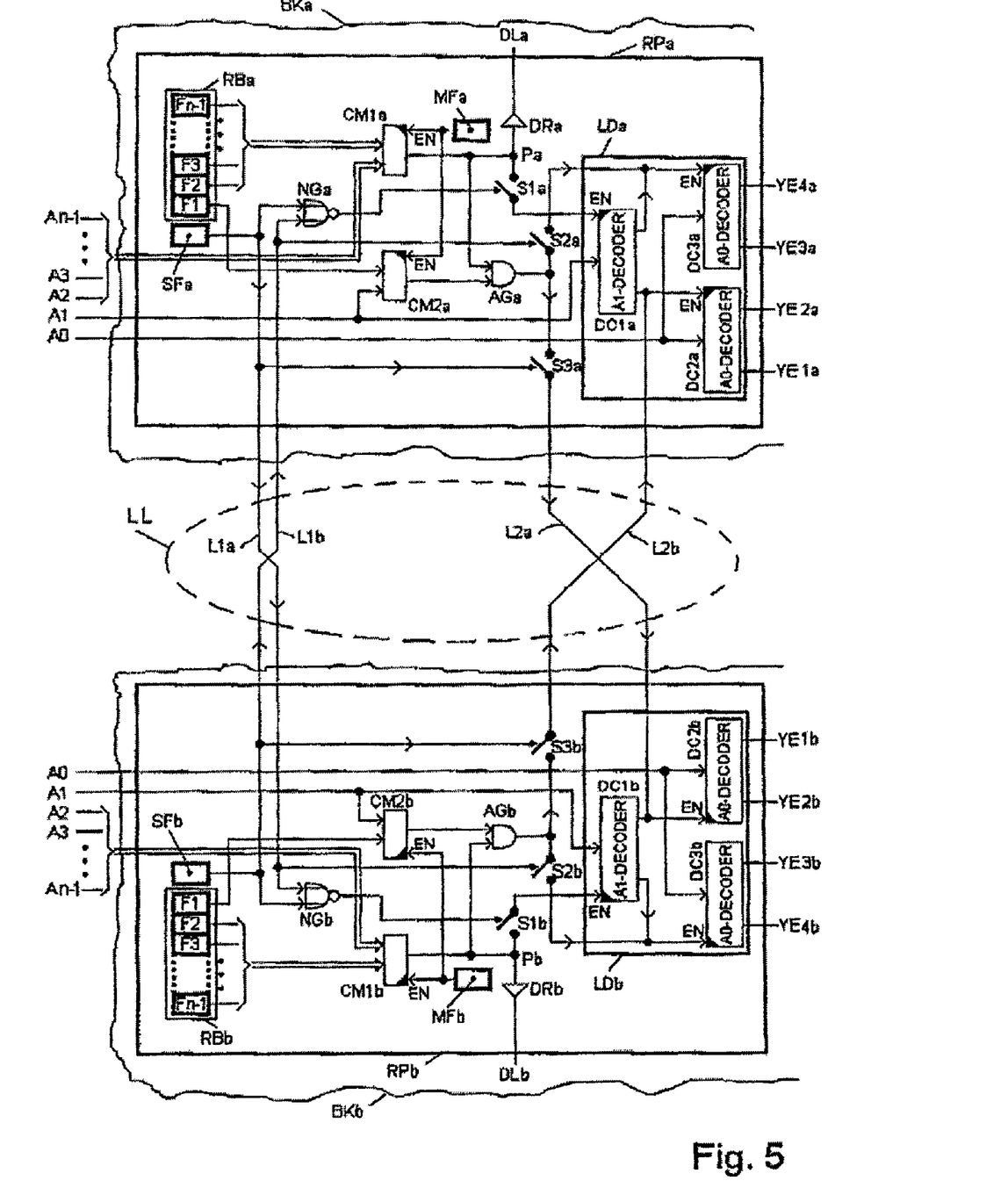
FIG. 5 shows an exemplary embodiment of a reciprocal connection of two repair circuits designed as partners.

FIG. 5 shows two repair circuits RPa and RPb, one of which belongs to a block BKa for an integrated module and the other of which belongs to another block BKb for the module. The module is designed like the module shown in FIG. 1, the only difference being that the repair circuits are organized in groups, specifically such that each repair circuit is associated with a group of K=4 redundant elements YE.

The two "four-group" repair circuits RPa and RPb shown in FIG. 5 are designed in similar fashion to one another. The components of both repair circuits are denoted by the same abbreviations in the figure, said abbreviations being followed by a respective lower case letter "a" or "b", depending on that instance of the two repair circuits RPa, RPb to which the relevant component belongs. It therefore suffices for the text below to describe just one of the repair circuits in detail, specifically the repair circuit RPa.

The repair circuit RPa is associated with a group of four redundant elements YE1a:4a in the block BKa and contains, inter alia, the components of the four-group repair circuit x4RP shown in FIG. 4, namely: a reference bit transmitter RBa, which contains fuses F2:1–n for programming reference bits for the n–2 most significant bits of an element address; a comparator CM1a for comparing these reference bits with the n–2 most significant address bits A2:1–n, a master bit fuse MFa for activating the comparator CM1a; a local decoding device LDa, comprising a tree circuit containing an A1 decoder DC1a and two downstream A0 decoders DC2a and DC3a, for selecting one of the four redundant elements on the basis of the two least significant bits A0:1 of the element address.

In addition, the repair circuit RPa shown in FIG. 5 contains the following: a further fuse F1 in the reference bit transmitter RBa and a second comparator CM2a for comparing the reference bit programmed by the fuse F1 with the second least significant address bit A1; various logic gates, switches and connecting lines in order to change over the repair circuit between two modes of operation on the basis of a control bit; a control bit fuse SFa for programming the control bit. The switches are shown symbolically as mechanical switches in FIG. 5, and an arrow pointing to the switch arm symbolizes the control connection. With logic value "1" on the control connection, the switch is closed, and with logic value "0" it is open. In reality, the switches are naturally electronic switches, e.g., produced by field effect transistors.

A first switch S1a, controlled by the output of a NOR gate NGa, can be used to isolate the activation input EN of the A1 decoder DC1a from any signal source, so that this decoder remains out of operation. The output of the second comparator CM2a delivers a second hits signal with the logic value "1" only if the reference bit F1 matches the address bit A1. The outputs of the two comparators CM1a and CM2a are connected to the two inputs of an AND gate AGa. When the first and second hits signals coincide, the output of the AND gate AGa delivers a third hits signal, which can be applied via a second switch S2a to the activation input of the A0 decoder DC3a, which selects between the redundant elements YE3a:4a. In addition, a third switch S3a is provided, one side of which is connected to the output of the AND gate AGa and which is controlled by the SFa control bit which is also applied to one input of the NOR gate NGa.

The two repair circuits RPa and RPb are connected to one another as "partners" by means of a cluster LL of four connecting lines L1a, L1b, L2a, L2b. The first connecting line L1a connects the control bit fuse SFa of the repair circuit RPa to an input of the NOR gate NGb and to the control connection of the switch S2b in the repair circuit RPb. Similarly, the second connecting line L1b connects the control bit fuse SFb of the repair circuit RPb to an input of the NOR gate NGa and to the control connection of the switch S2a in the repair circuit RPa. The third connecting line L2a is used to set up a connection running via the switch S3a from the output of the AND gate AGa in the repair circuit RPa to the activation input EN of the A0 decoder DC2b in the repair circuit RPb, said A0 decoder DC2b being associated with the two redundant elements YE1b:2b. Similarly, the fourth connecting line L2b is used to set up a connection running via the switch S3b from the output of the AND gate AGb in the repair circuit RPb to the activation input EN of the A0 decoder DC2a in the repair circuit RPa, said A0 decoder DC2a being associated with the two redundant elements YE1a:2a.

If the control bits SFa and SFb in both repair circuits RPa and RPb have the logic value "0", the following switching states arise: the NOR gates NGa and NGb respectively deliver a "1", so that the switch S1a in the repair circuit RPa and the switch S1b in the repair circuit RPb are closed. The switches S2a and S3a in the repair circuit RPa and the switches S2b and S3b in the repair circuit RPb are open; as a result, the output of the AND gate AG2a or AG2b is isolated from all other circuit components, so that the second hits signal from the output of the second comparator CM2a or CM2b remains ineffective. Only the first hits signal from the output of the first comparator CM1a or CM1b can be effective via the closed switch S1a or S1b in order to use the respective associated local decoding device LDa or LDb as a 1-of-4 decoder.

In this situation, the partnership of the two repair circuits RPa and RPb is ineffective, and each of them can operate on its own as a four-group repair circuit, as was described with reference to FIG. 4 for the repair circuit x4RP1. That is to say that by programming the fuses F2:Fn–1 in the repair circuit RPa in a block BKa the addressing of a group of four regular elements XE in this block is diverted to the group of four YE1a:4a (or YE1b:4b) in the same block. This mode of operation is referred to as "separate mode" here.

By programming the master bits MFa and MFb of both repair circuits RPa and RPb to "1" and programming one of the control bits SFa or SFb to the logic value "1", the repair circuits can be conditioned such that their partnership is effective to divert the addressing of regular elements in a block to redundant elements in the other block. The conditioning to such a "partner mode" is described below for the exemplary case in which the control bit SFa in the repair circuit RPa has been set to "1", while the control bit SFb in the repair circuit RPb remains at "0".

With SFa="1" and SFb="0", the NOR gates NGa and NGb respectively deliver a "0", so that the switches S1a and S1b are opened. This means that the A1 decoders DC1a and DC1b in both repair circuits remain inactive. On account of SFb="0", the switches S3b and S2a remain open. As a result of this and on account of the inactive A1 decoder DC1a in the repair circuit RPa, both A0 decoders DC2a and DC3a in this repair circuit are excluded from activation, so that none of the associated four redundant elements YE1a:4a can be selected. On account of SFa="1", however, the switches S3a and S2b are closed. The closed switch S3a means that the connecting line L2a is used to set up a connection from the output of the AND gate AGa in the repair circuit RPa to the activation input EN of the first A0 decoder DC2b in the other repair circuit RPb. The closed switch S2b means that a connection is set up from the output of the AND gate AGb in the repair circuit RPb to the activation input EN of the second A0 decoder DC3b in this repair circuit.

This conditioning of the two repair circuits RPa and RPb is useful when, in two different groups of four regular elements XE, only one respective half-group is faulty (i.e. contains at least one faulty element). Each of these half-groups is identifiable by the address bits A1:n–1. Accordingly, the fuses F1:n–1 in the reference bit transmitter RBa of the repair circuit RPa are programmed to the address bits A1:n–1 of the first faulty half-group, and the fuses F1:n–1 in the reference bit transmitter RBb of the other repair circuit RPb are programmed to the address bits A1:n–1 for the second faulty half-group.

If, in this state of the two repair circuits RPa and RPb, a regular element in the first half-group from the block BKa is addressed, both comparators CM1a and CM2a in the repair circuit RPa deliver a "1", so that the AND gate AGa in this repair circuit delivers a "1". Via the closed switch S3a and the connecting line L2a, this "1" arrives at the activation input EN of the first A0 decoder DC2b in the other repair circuit RPb, said A0 decoder DC2b being associated with the two redundant elements YE1b and YE2b. This decoder then selects the element YE1b or YE2b on the basis of the address bit A0.

If a regular element in the second half-group from the block BKa is addressed, both comparators CM1b and CM2b in the other repair circuit RPb deliver a "1", so that the AND gate AGb in this repair circuit delivers a "1". Via the closed switch S2b, this "1" arrives at the activation input EN of the second A0 decoder DC2b in the repair circuit RPb, said A0 decoder DC2b being associated with the two redundant elements YE3b and YE4b. This decoder then selects the element YE3b or YE4b on the basis of the address bit A0.

In the example of the partner mode described above, the repair circuit RPb is a "loaned" repair circuit which repairs faulty elements from the other block BKa using redundant elements in its own block BKb. The repair circuit RPa is used only as a "loaning" repair circuit which is conditioned by setting its control bit SFa to the logic value "1" in order to operate the loaned repair circuit as such.

This role distribution for the two repair circuits RPa and RPb can be swapped by keeping the control bit SFa at "0" and instead setting the control bit SFb to "1". For this case, the above function description of the partner mode applies with the stipulation that the lower case letters "a" and "b" in the labels for the circuit components are swapped.

The embodiment of two repair circuits selected as partners which was described above with reference to FIG. 5 is just one example of the case in which the number K of elements per group is equal to 4. The number K may be any desired power k>0 of 2, that is to say, equal to 2, 4, 8, etc., up to a maximum of K=M. In general, the respective reference bit transmitter in the repair circuits which are to be selected as partners can be programmed to the n−k+1 most significant bits of the n-bit element address, and each of these repair circuits contains a local decoding device which can be operated either as a 1-of-K decoder for selecting an element from a group of K elements on the basis of the k least significant bits of the element address or as two 1-of-K/2 decoders for selecting a respective element from a group of K/2 elements on the basis of the k−1 least significant bits of the element address.

However, a necessary condition for the use of two repair circuits from different blocks in partner mode is that neither of these two repair circuits is used to repair an entire group of K regular elements in the relevant block. The partner mode also allows a block to be repaired which contains faults in more than M/K groups of regular elements, but only under the prerequisite that fewer than M/K entire groups need to be repaired. If only −Z entire groups need to be repaired in a block then there are Z repair circuits in the block available to repair a total of 2*Z additional half-groups in partnership with Z repair circuits from another block (or from various other blocks). The optimum flexibility of repair is obtained when, in one advantageous embodiment of the invention, all the repair circuits in all the blocks can be conditioned for operation in the partner mode. However, the flexibility is also improved merely if just one subset of the repair circuits (or even just a single repair circuit) in each block can be conditioned for a partner mode.

Figure 6:
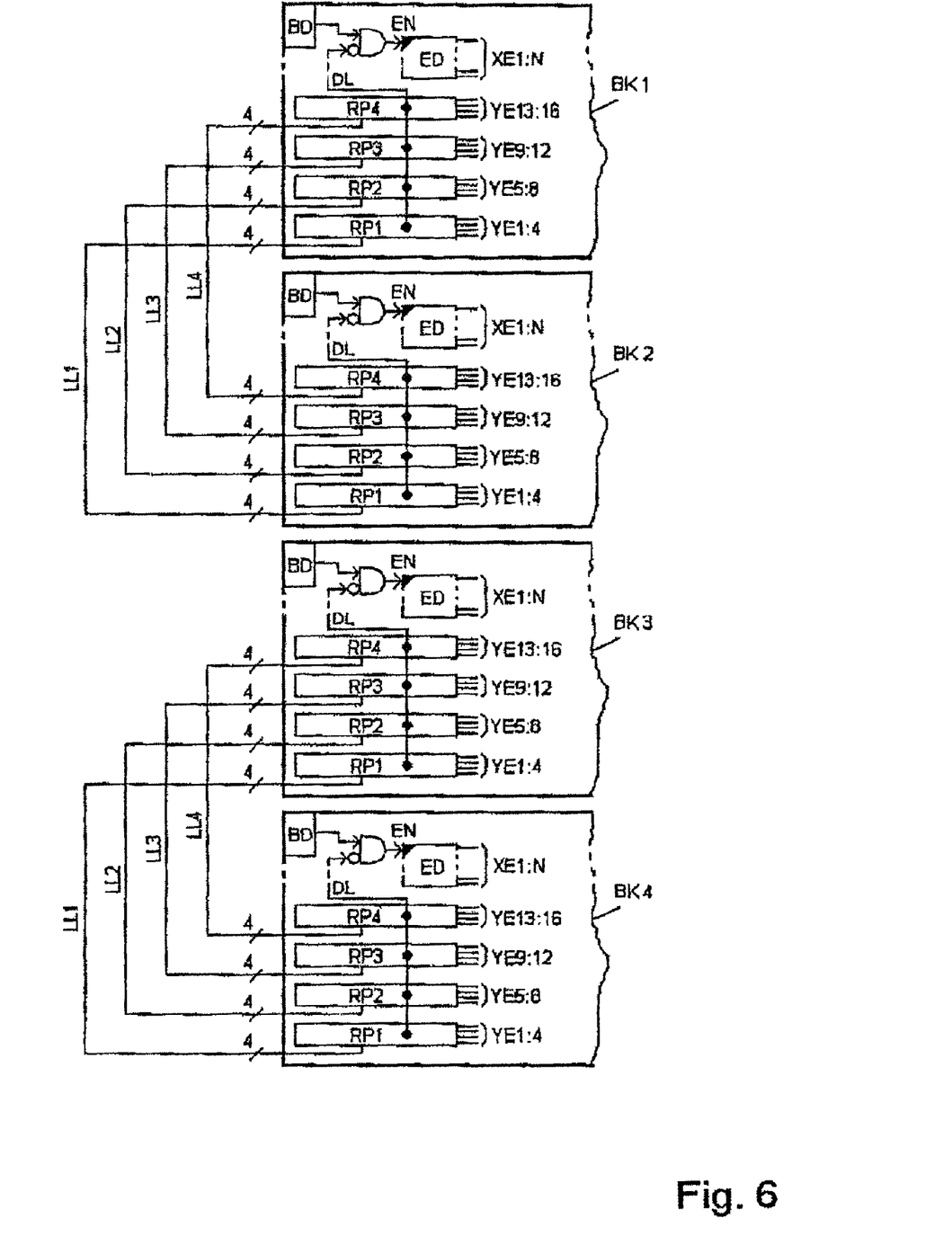
FIG. 6 shows a fragmentary view of an integrated module having a plurality of blocks which respectively contain selectively addressable regular and redundant elements and repair circuits.

FIG. 6 shows an example of the partner association for repair circuits in a module which, in similar fashion to the module shown in FIG. 1, contains four blocks BK1:4 each having N regular elements XE and M redundant elements YE, where M=16. The blocks shown in FIG. 6 differ from the blocks shown in FIG. 1 only in that all the repair circuits are four-way repair circuits, that is to say are respectively associated with a group of K=4 redundant elements YE, and respectively have a design which is based on the invention, is shown in FIG. 5 and makes them suitable for a partner mode. All the other components of the module are designed exactly as described with reference to FIG. 1 and are also denoted by the same abbreviations as therein. The supply lines (which are also present in the case of the module shown in FIG. 6) for the block address bits B0:1 and the element address bits A0:n−1 are not shown in this figure for reasons of clarity, however.

As FIG. 6 shows, each of the four repair circuits RP1:4 for the block BK1 is associated with precisely one of the four repair circuits RP1:4 for the block BK2 as a partner. The association is made by virtue of the two repair circuits in each partner pair being connected to one another by means of a bus LL of 4 lines, respectively as shown in FIG. 5 for the two repair circuits RPa and RPb. A similar association is also made between the repair circuits for the two other blocks BK3 and BK4.

As already indicated at the outset, the invention can be used to good effect in memory modules, in which a multiplicity of memory cells is distributed over a plurality of blocks, in each case in the form of a matrix of rows and columns. In the case of memory modules, such blocks are also referred to as "banks". Each row has an associated row line, usually referred to as a "word line" or "WL" for short. Each column quadruple has an associated column selection line, often denoted by "CSL" (column select line) for short. Targeted access to the cells within each block (that is to say within each bank) is effected by activating a word line on the basis of a row address and activating a column selection line on the basis of a column address. The lines are usually activated by changing over the relevant line from an "inactive" potential (corresponding to a logic "0") to an "active" potential (corresponding to a logic "1"). Such a memory module is provided not only with the regular matrix rows but also usually with redundant matrix rows; instead of that or in addition, it is also possible to provide redundant column quadruples. In both cases, the invention is of benefit in order, in the event of faults in the memory cells, to prevent relevant row or column selection lines from being activated and to divert the addressing to the row or column selection lines for redundant rows or column quadruples. Hence, what have been referred to in the description of the invention as "regular and redundant elements" are in this case the selection lines for regular and redundant rows or column quadruples.

The invention is not limited to memory modules, however, but can be applied advantageously anywhere where it is necessary to select an element from any of a set of regular elements and a set of redundant elements in each case on the basis of an address.

The preceding description describes advantageous exemplary embodiments. The features disclosed therein and the claims and the drawings can, therefore, be useful for realizing various embodiments, both individually and in any combination. While the foregoing is directed to specific embodiments, other and further embodiments may be devised without departing from the basic scope, the scope being determined by the claims that follow.

What is claimed is:

1. An integrated electrical module, comprising:
a set of regular elements and a set of redundant elements, which are split over at least two blocks, comprising a first block and a second block, which blocks are individually selectable by an input address, each block containing regular elements and redundant elements; and
two repair circuits, each repair circuit being associated to one respective block, wherein the two repair circuits can be conditioned as a pair for a partner mode of operation, in which the addressing of an element from a first half-group of regular elements in the first block is diverted to a first half-group of elements in the second block and the addressing of an element from a second half-group of regular elements in the first block is diverted to a second half-group of elements in the second block.

2. The integrated electrical module as claimed in claim 1, wherein the two repair circuits are interconnected and can be conditioned for the partner mode of operation in which a local decoding device for one of the two repair circuits is deactivated and a local decoding device for the other repair circuit selects the element identified by significant address bits either from one or the other half of the associated group of redundant elements on the basis of whether the most significant bits of a received element address match the programming in the one repair circuit or in the other repair circuit.

3. The integrated electrical module as claimed in claim 2, wherein each of two interconnected repair circuits contains an additional control bit fuse for programming a control bit for conditioning the two repair circuits selectively between a first mode of operation and the partner mode of operation.

4. The integrated electrical module as claimed in claim 3, wherein each of two interconnected repair circuits is conditioned for the first mode of operation when control bits programmed in both repair circuits have a first logic value; and
wherein the pair of two interconnected repair circuits is conditioned for the partner mode of operation when control bits programmed in the respective repair circuits have different logic values, a role distribution of the two repair circuits being dependent on which control bit has the first logic value.

5. The integrated electrical module as claimed in claim 3, wherein the local decoding device in each of two interconnected repair circuits contains two 1-of-K/2 decoders and a separate 1-of-2 decoder, and
wherein the separate 1-of-2 decoder is connected upstream of the two 1-of-K/2 decoders in order to configure the local decoding device as a 1-of-K decoder when the repair circuits are conditioned for the first mode of operation.

6. The integrated electrical module as claimed in claim 5, wherein each of two interconnected repair circuits contains a first comparator and a second comparator, wherein the first comparator delivers a first hits signal if a pattern of the most significant bits of an element address matches a pattern which is programmed in a reference bit transmitter for these bits, and wherein the second comparator delivers a second hits signal if a next least significant bit of the element address matches the logic value which is programmed in the reference bit transmitter for this bit;
wherein each of two interconnected repair circuits contains a combinational logic circuit which delivers a third hits signal only if the first and second hits signals coincide;
wherein if the two interconnected repair circuits are conditioned for the first mode of operation, then the first hits signal from each of these repair circuits activates an attendant local decoding device as a 1-of-K decoder; and
wherein if the two interconnected repair circuits are conditioned for the partner mode of operation, then the third activation signal from one of the two repair circuits activates the first 1-of-K/2 decoder in the other repair circuit, and the third activation signal from the other repair circuit activates the second 1-of-K/2 decoder in the other repair circuit.

7. The integrated electrical module as claimed in claim 1, wherein the module is a memory module in which each block contains a plurality of memory cells which form a matrix of rows and columns, and
wherein the regular elements and redundant elements are respectively row quadruples in the matrix which are selected by activating a respective associated row selection line or the regular elements and redundant elements are respectively column quadruples in the matrix which are selected by activating a respective associated column selection line.

8. An integrated electrical module, comprising:
a set of regular elements and a set of redundant elements, which are split over at least two blocks which are individually selectable by an input address, each block containing regular elements and redundant elements;
two interconnected repair circuits, each repair circuit being associated to a respective block; and
a switchable connection configured between the two repair circuits,
wherein each repair circuit contains fuses for programming a number of most significant bits of an element address, and
wherein the two interconnected repair circuits can be conditioned for a partner mode of operation in which a local decoding device for one of the two repair circuits is deactivated and a local decoding device for the other repair circuit selects the element identified by significant address bits either from one or the other half of an associated group of redundant elements on the basis of whether the most significant bits of a received element address match programming in the one repair circuit or in the other repair circuit.

9. The integrated electrical module as claimed in claim 8, wherein each of the two interconnected repair circuits contains an additional control bit fuse for programming a control bit for conditioning the two repair circuits selectively between a first mode of operation and the partner mode of operation.

10. The integrated electrical module as claimed in claim 9, wherein each of two interconnected repair circuits is conditioned for a first mode of operation if control bits programmed in both repair circuits have a first logic value, and
wherein the pair of two interconnected repair circuits is conditioned for the partner mode of operation if control bits programmed in the repair circuits have different logic values, a role distribution of the two repair circuits being dependent on which control bit has the first logic value.

11. The integrated electrical module as claimed in claim 9, wherein the local decoding device in each of two interconnected repair circuits contains two 1-of-K/2 decoders and a separate 1-of-2 decoder, and
wherein the separate 1-of-2 decoder is connected upstream of the two 1-of-K/2 decoders in order to configure the local decoding device as a 1-of-K decoder when the repair circuits are conditioned for the first mode of operation.

12. The integrated electrical module as claimed in claim 11,
wherein each of two interconnected repair circuits contains a first comparator and a second comparator, wherein the first comparator delivers a first hits signal if the pattern of the most significant bits of the element address matches the pattern which is programmed in a reference bit transmitter for these bits, and wherein the second comparator delivers a second hits signal if the next least significant bit of the element address matches the logic value which is programmed in the reference bit transmitter for this bit;
wherein each of two interconnected repair circuits contains a combinational logic circuit which delivers a third hits signal only if the first and second hits signals coincide;
wherein if the two interconnected repair circuits are conditioned for the first mode of operation, then the first hits signal from each of these repair circuits activates the attendant local decoding device as a 1-of-K decoder;
wherein if the two interconnected repair circuits are conditioned for the partner mode of operation, then the third activation signal from one of the two repair circuits activates the first 1-of-K/2 decoder in the other repair circuit, and the third activation signal from the other repair circuit activates the second 1-of-K/2 decoder in this other repair circuit.

13. The integrated electrical module as claimed in claim 8,
wherein the module is a memory module in which each block contains a plurality of memory cells which form a matrix of rows and columns, and
wherein the regular elements and redundant elements are respectively row quadruples in the matrix which are selected by activating a respective associated row selection line or the regular elements and redundant elements are respectively column quadruples in the matrix which are selected by activating a respective associated column selection line.

14. An integrated electrical module, comprising:
an addressing device for selecting an element from any of a set of regular elements in the module and a set of redundant elements in the module based on binary values of bits of an input address;
wherein the regular elements and the redundant elements are split over at least two blocks which are individually selectable by block address bits of the input address;
wherein each block comprises:
  N regular elements and M<N redundant elements, wherein $N=2^n$;
  a 1-of-N decoder for selecting one of the N regular elements in the block on the basis of n element address bits of the input address; and
  at least one repair circuit which is associated with a group of $K=2^k$ redundant elements in the block, which is connected for receiving the n element address bits, and which contains a local decoding device and fuses, wherein the repair circuit, in a first mode of operation, upon receipt of a pattern, can be programmed by the fuses, for the n–k most significant element address bits, to deactivate the 1-of-N decoder and to activate the local decoding device as a 1-of-K decoder in order to select one of the associated K redundant elements on the basis of the k–1 least significant element address bits;
wherein a switchable connection is configured between at least one repair circuit for each block and precisely one repair circuit for another block;
wherein each of two connected repair circuits contains n–k+1 fuses for programming the n–k+1 most significant bits of an element address, and
wherein each pair of interconnected repair circuits can be conditioned for a partner mode of operation in which the local decoding device for one of the two repair circuits is deactivated and the local decoding device for the other repair circuit selects the element identified by the k–1 least significant address bits either from one or the other half of the associated group of K redundant elements on the basis of whether the n–k+1 most significant bits of a received element address match programming in the one repair circuit or in the other repair circuit.

15. The integrated electrical module as claimed in claim 14,
wherein each of two interconnected repair circuits contains an additional control bit fuse for programming a control bit for conditioning the two repair circuits selectively between the first mode of operation and the partner mode of operation.

16. The integrated electrical module as claimed in claim 15,
wherein each of two interconnected repair circuits is conditioned for the first mode of operation if the control bits programmed in the repair circuits have a first logic value, and
wherein each pair of two interconnected repair circuits is conditioned for a partner mode of operation if the control bits programmed in the repair circuits have different logic values, a role distribution of the two repair circuits being dependent on which control bit has the first logic value.

17. The integrated electrical module as claimed in claim 14,
wherein the local decoding device in each of two interconnected repair circuits contains two 1-of-K/2 decoders and a separate 1-of-2 decoder, and
wherein the separate 1-of-2 decoder is connected upstream of the two 1-of-K/2 decoders in order to configure the local decoding device as a 1-of-K decoder when the repair circuits are conditioned for the first mode of operation.

18. The integrated electrical module as claimed in claim 17,
wherein each of two interconnected repair circuits contains a first comparator and a second comparator, wherein the first comparator delivers a first hits signal if the pattern of the n–k most significant bits of the element address matches the pattern which is programmed in the reference bit transmitter for these bits, and wherein the second comparator delivers a second hits signal if the next least significant bit of the element address matches the logic value which is programmed in the reference bit transmitter for this bit;
wherein each of two interconnected repair circuits contains a combinational logic circuit which delivers a third hits signal only if the first and second hits signals coincide;
wherein if the two interconnected repair circuits are conditioned for the first mode of operation, then the first hits signal from each of these repair circuits activates the attendant local decoding device as a 1-of-K decoder;
wherein if the two interconnected repair circuits are conditioned for the partner mode of operation, then the third activation signal from one of the two repair circuits activates the first 1-of-K/2 decoder in the other repair circuit, and the third activation signal from the other repair circuit activates the second 1-of-K/2 decoder in this other repair circuit.

19. The integrated electrical module as claimed in claim 14,
wherein the module is a memory module in which each block contains a plurality of memory cells which form a matrix of rows and columns, and
wherein the regular elements and redundant elements are respectively row quadruples in the matrix which are selected by activating a respective associated row selection line or the regular elements and redundant elements are respectively column quadruples in the matrix which are selected by activating a respective associated column selection line.

* * * * *